(12) United States Patent
Mochizuki

(10) Patent No.: US 11,502,405 B2
(45) Date of Patent: Nov. 15, 2022

(54) TRANSMISSION/RECEPTION BASEBAND-PROCESSING DEVICE, COMMUNICATION SYSTEM, CORRECTION METHOD, AND PROGRAM

(71) Applicant: NEC Corporation, Tokyo (JP)

(72) Inventor: Takuji Mochizuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 531 days.

(21) Appl. No.: 16/589,427

(22) Filed: Oct. 1, 2019

(65) Prior Publication Data

US 2020/0112096 A1 Apr. 9, 2020

(30) Foreign Application Priority Data

Oct. 3, 2018 (JP) .............................. JP2018-188419

(51) Int. Cl.
| | | |
|---|---|---|
| *H04B 17/00* | (2015.01) | |
| *H01Q 3/26* | (2006.01) | |
| *G06F 17/14* | (2006.01) | |
| *H03F 1/02* | (2006.01) | |
| *H04B 1/04* | (2006.01) | |

(52) U.S. Cl.
CPC ........... *H01Q 3/267* (2013.01); *G06F 17/142* (2013.01); *H03F 1/0227* (2013.01); *H04B 1/0466* (2013.01); *H04B 2001/045* (2013.01)

(58) Field of Classification Search
CPC .. H01B 1/0466; H04B 7/0615; H04B 7/0617; H04B 7/0619; H04B 17/11; H04B 17/21; H01Q 3/267
See application file for complete search history.

(56) References Cited

U.S. PATENT DOCUMENTS

| | | | | |
|---|---|---|---|---|
| 2010/0254299 A1* | 10/2010 | Kenington | ............. | H04B 7/063 375/296 |
| 2012/0326781 A1 | 12/2012 | Mori et al. | | |
| 2016/0197660 A1* | 7/2016 | O'Keeffe | ............. | H04W 16/28 370/329 |

FOREIGN PATENT DOCUMENTS

| | | |
|---|---|---|
| JP | 2005-348235 A | 12/2005 |
| JP | 2005-348335 A | 12/2005 |
| JP | 2006-279902 A | 10/2006 |
| JP | 2009-278529 | 11/2009 |
| JP | 2016-208088 | 12/2016 |
| WO | 2011/108103 A1 | 9/2011 |

OTHER PUBLICATIONS

Japanese Office Action for JP Application No. 2018-188419 dated May 17, 2022 with English Translation.

* cited by examiner

*Primary Examiner* — Tuan Pham
(74) *Attorney, Agent, or Firm* — Sughrue Mion, PLLC

(57) ABSTRACT

A transmission/reception baseband-processing device includes a calibration-processing unit configured to correct an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit.

5 Claims, 9 Drawing Sheets

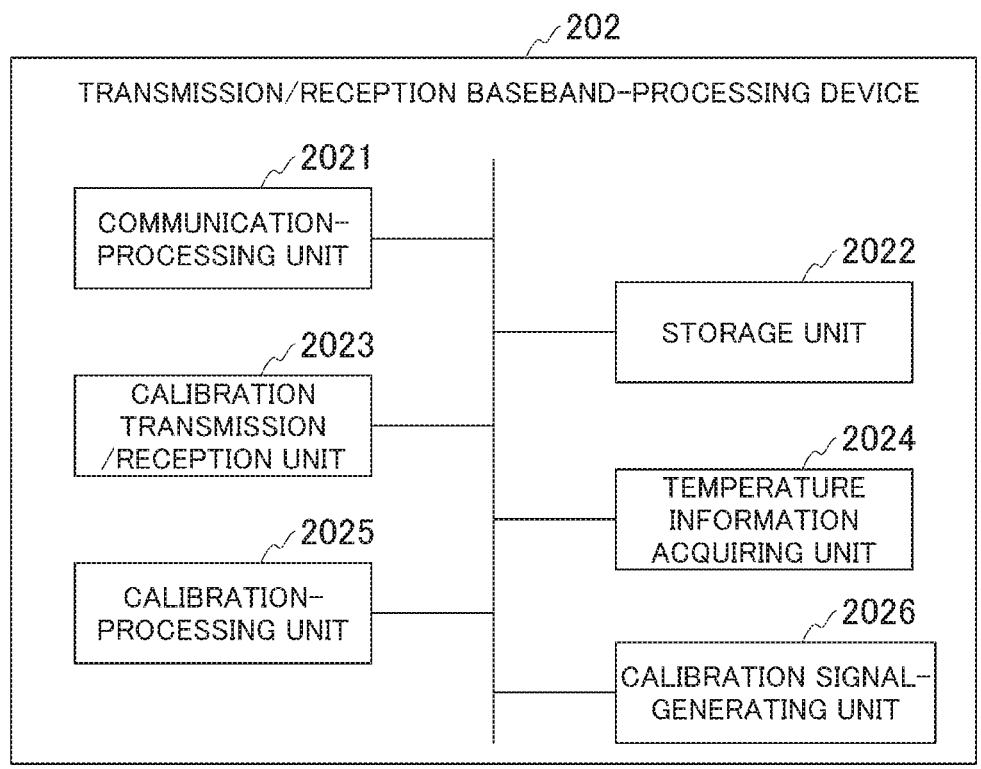

TRANSMISSION/RECEPTION BASEBAND-PROCESSING DEVICE, COMMUNICATION SYSTEM, CORRECTION METHOD, AND PROGRAM

INCORPORATION BY REFERENCE

This application is based upon and claims the benefit of priority from Japanese patent application No. 2018-188419, filed Oct. 3, 2018, the disclosure of which is incorporated herein in its entirety by reference.

BACKGROUND OF THE INVENTION

Field of the Invention

The present invention relates to a transmission/reception baseband-processing device, a communication system, a correction method, and a program.

Description of Related Art

With the rapid spread of radio communication, there is a problem in that frequency bands used for radio communication have become insufficient. As one of technologies for effectively using frequency bands, there is beamforming. Beamforming is a technology that enables radio communication with a predetermined communication target by radiating radio waves having directivity and is a technology capable of inhibiting interference with other radio systems and the like while maintaining the quality of signals.

As a representative technique realizing beamforming, there is a phased array. The phased array is a technology for strengthening signals in a desired direction by adjusting phases and amplitudes of radio signals fed to a plurality of antenna devices in a transmitter and synthesizing radio waves radiated from the antenna devices in a space.

As relating technologies, technologies relating to transmitters are disclosed in PCT International Publication No. WO2011/108103, Japanese Unexamined Patent Application, First Publication No. 2006-279902, or Japanese Unexamined Patent Application, First Publication No. 2005-348235.

However, in order for a transmitter to transmit a signal in a desired direction using the beamforming technology, it is necessary to perform calibration so as to correct variations in amplitude-phase characteristics of a plurality of mounted transmitters and configure the amplitude-phase characteristics to be the same such that desired signals can be acquired in each of a plurality of antenna devices.

SUMMARY OF THE INVENTION

An object of each aspect of the present invention is to provide a transmission/reception baseband-processing device, a communication system, a correction method, and a program capable of solving the problems described above.

In order to achieve the object described above, according to one aspect of the present invention, there is provided a transmission/reception baseband-processing device, including: a calibration-processing unit configured to correct an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit.

In order to achieve the object described above, according to another aspect of the present invention, there is provided a communication system, including: the transmission/reception baseband-processing device described above; and a baseband circuit unit configured to output a beamforming signal to the transmission/reception baseband-processing device.

In order to achieve the object described above, according to one aspect of the present invention, there is provided a correction method, including: correcting an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit.

In order to achieve the object described above, according to one aspect of the present invention, there is provided a program causing a computer to execute: correcting an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit.

According to each aspect of the present invention, transmitters can be correctly calibrated.

BRIEF DESCRIPTION OF THE DRAWINGS

FIG. 3 is a diagram illustrating the configuration of a transmission/reception baseband-processing device according to the first embodiment of the present invention;

FIG. 4 is a diagram illustrating one example of a data table according to the first embodiment of the present invention;

DETAILED DESCRIPTION OF THE INVENTION

Hereinafter, embodiments will be described in detail with reference to the drawings.

<Configuration Common to Each Embodiment and Principle of Calibration>

A communication system 1 according to each embodiment of the present invention corrects differences in amplitude-phase variations between transmission/reception units that occur due to aging variations and outside air temperature variations under long-term operation by sequentially performing calibration periodically. The communication system 1, for example, is an active antenna system (AAS).

Before communication systems 1 according to embodiments will be individually described, a configuration common to the communication systems 1 according to the embodiments and the principle of calibration common to the embodiments will be described.

Configuration Common to Embodiments

First, a configuration common to communication systems 1 according to embodiments of the present invention will be described.

Figure 1:
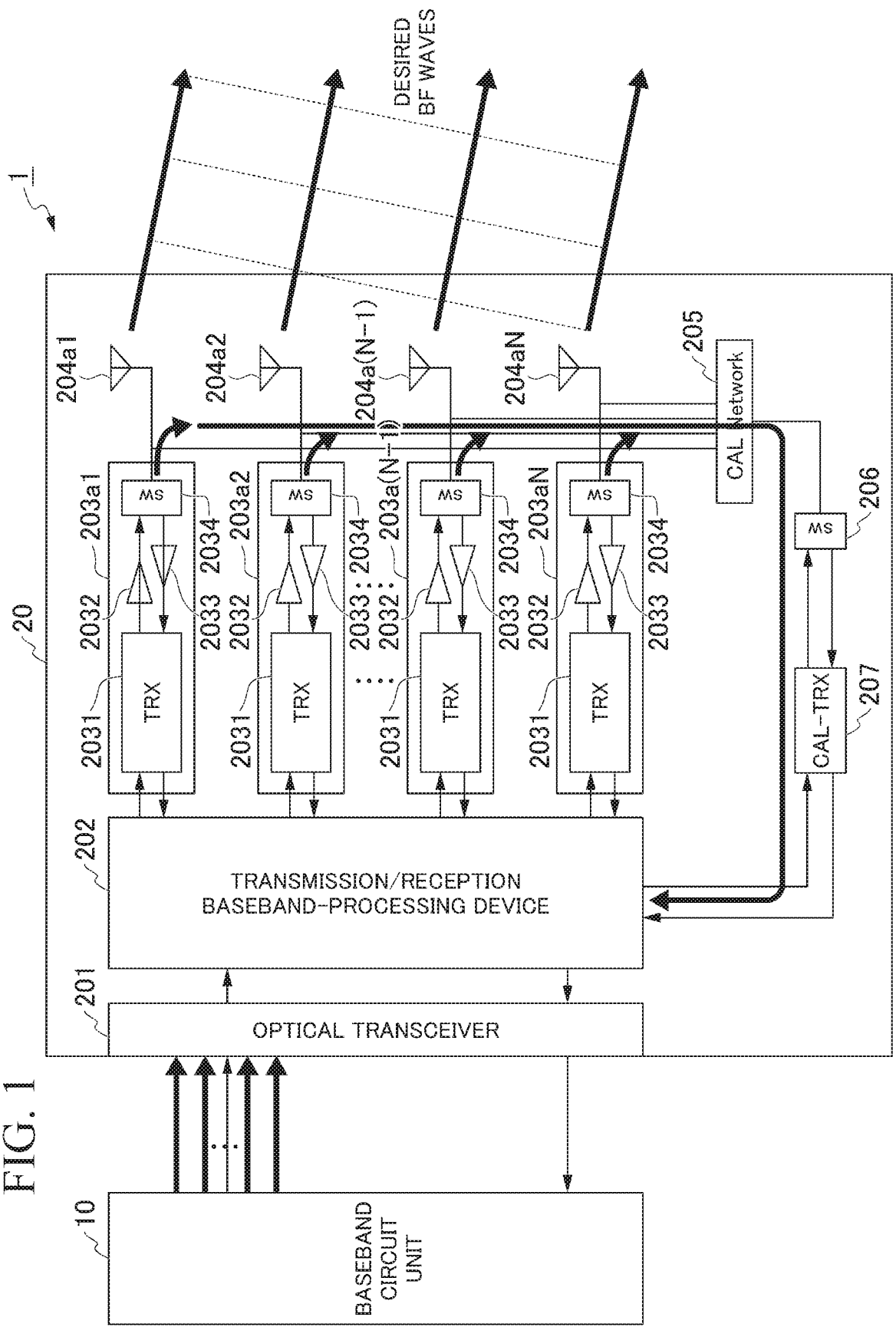
FIG. 1 is a diagram illustrating a configuration common to embodiments of the present invention and the principle of calibration.

The communication system 1, as illustrated in FIG. 1, includes a baseband circuit unit 10 and a communicator 20. The communication system 1 performs communication using a beamforming technology and transmits a beamforming signal (hereinafter, referred to as a "BF signal") in a time-divisional manner at the time of transmission.

The baseband circuit unit 10 generates a desired BF signal (corresponding to a BF signal (n) before correction in Equation (1) to be described later) to be transmitted from antennas. The baseband circuit unit 10 outputs the generated BF signal to the communicator 20 as a digital optical signal.

The communicator 20, as illustrated in FIG. 1, includes an optical transceiver 201, a transmission/reception baseband-processing device 202, transmission/reception front end-processing units 203a1, 203a2, ..., 203a(N−1), and 203aN, antennas 204a1, 204a2, ..., 204a(N−1), and 204aN, a calibration network 205, a switch 206, and a calibration transmission/reception unit 207.

The transmission/reception front end-processing units 203a1, 203a2, ..., 203a(N−1), and 203aN will be collectively referred to as a transmission/reception front end-processing unit 203. In addition, the antennas 204a1, 204a2, ..., 204a(N−1), and 204aN will be collectively referred to as an antenna 204.

The optical transceiver 201 converts an optical signal into an electrical signal and converts an electrical signal into an optical signal.

For example, when a transmission signal is received from the baseband circuit unit 10 as a digital optical signal, the optical transceiver 201 converts the digital optical signal into a digital electrical signal. The digital transmission signal converted into the electrical signal by the optical transceiver 201 is input to the transmission/reception baseband-processing device 202.

In addition, for example, when a reception signal is received from the transmission/reception baseband-processing device 202 as a digital electrical signal, the optical transceiver 201 converts the digital electrical signal into a digital optical signal. The digital reception signal converted into the optical signal by the optical transceiver 201 is input to the baseband circuit unit 10.

Each of the transmission/reception front end-processing units 203 includes a transmission/reception unit 2031, a transmission amplifier 2032, a reception amplifier 2033, and a switch 2034.

The transmission/reception unit 2031 is connected to the transmission/reception baseband-processing device 202, an input of the transmission amplifier 2032, and an output of the reception amplifier 2033. The switch 2034 is connected to an output of the transmission amplifier 2032, an input of the reception amplifier 2033, and a corresponding antenna 204.

The transmission/reception unit 2031 performs a process of transmitting an analog transmission signal from the antenna 204.

For example, the transmission/reception unit 2031 includes a filter and performs a filter process for an analog transmission signal such that it has a desired frequency component. Then, the transmission/reception unit 2031 outputs the transmission signal to the transmission amplifier 2032.

In addition, the transmission/reception unit 2031 performs a process of receiving an analog signal from the connected antenna 204.

For example, the transmission/reception unit 2031 includes a filter and performs a filter process for an analog reception signal received from the antenna 204 through the reception amplifier 2033 such that it has a desired frequency component. Then, the transmission/reception unit 2031 outputs the reception signal to the transmission/reception baseband-processing device 202.

The transmission amplifier 2032 amplifies an analog transmission signal received from the transmission/reception unit 2031 such that it has a desired amplitude.

The reception amplifier 2033 amplifies an analog signal received from the antenna 204 such that it has a desired amplitude.

The switch 2034 connects the transmission amplifier 2032 and the antenna 204 at the time of transmission. On the other hand, the switch 2034 connects the reception amplifier 2033 and the antenna 204 at the time of reception.

Each of the antennas 204 radiates a transmission signal that is an electrical signal output by the transmission amplifier 2032 as an electromagnetic wave at the time of transmission. In addition, each of the antennas 204 outputs a received electromagnetic wave to the transmission/reception front end-processing unit 203 as an electrical signal at the time of reception.

When the transmission/reception baseband-processing device 202 is transmitting/receiving no signal through the antenna 204, the calibration network 205 receives signals output by the transmission/reception front end-processing units 203. Then, the calibration network 205 selects a signal that is a measurement target among the received signals and outputs the selected signal to the transmission/reception baseband-processing device 202 through the switch 206 and the calibration transmission/reception unit 207.

The switch 206 sets the calibration network 205 and the calibration transmission/reception unit 207 to a connected state or an open state by connecting or opening terminals thereof on the inside.

The calibration transmission/reception unit 207 is disposed for calibration. The calibration transmission/reception unit 207 includes a reception unit (one example of a calibration reception unit) and a transmission unit. The reception unit converts a signal received by each antenna 204 into a signal of a baseband frequency band that can be read by the transmission/reception baseband-processing device 202. The transmission unit converts a signal of a baseband frequency band into a signal of a transmission frequency band.

The transmission/reception baseband-processing device 202 is a processing unit that performs a process of communication with an external device through the antenna 204. In addition, the transmission/reception baseband-processing device 202 performs signal processing for calibration in the communication system 1.

(Principle of Calibration)

Next, the principle of calibration common to the embodiments of the present invention will be described with reference to FIG. 1.

For example, in a case in which the communication system 1 is an active antenna system, first, amplitude and phase characteristics (hereinafter, referred to as an "amplitude-phase characteristics) of the transmission/reception front end-processing units 203 connected to the plurality of antennas 204 are calibrated, and differences in variations of the amplitude-phase characteristics of the transmission/reception front end-processing units 203 are corrected. A transmission output absolute level is set in the Radio Act, the 3rd Generation Partnership Project (3GPP), and the like. For this reason, it is important to realize a stable transmission output absolute level within an allowed range and maintain the area coverage of a downlink such that it is constant.

More specifically, calibration of the amplitude-phase characteristics of the transmission/reception front end-processing units 203 is based on the principle described below.

First, when no signal is transmitted and received through the antenna 204, the transmission/reception baseband-processing device 202 switches a connection destination of the calibration network 205, for example, in order of the transmission/reception front end-processing units 203a1, 203a2, . . . , 203a(N−1), and 203aN. The transmission/reception baseband-processing device 202 sequentially measures a measurement target signal 1 passing through a path 1, a measurement target signal 2 passing through a path 2, . . . , a measurement target signal (N−1) passing through a path (N−1), and a measurement target signal N passing through a path N.

Here, the path 1 is a path passing through a transmission unit of the transmission/reception front end-processing unit 203a1, the calibration network 205, the switch 206, and a reception unit of the calibration transmission/reception unit 207. In addition, the path 2 is a path passing through a transmission unit of the transmission/reception front end-processing unit 203a2, the calibration network 205, the switch 206, and the reception unit of the calibration transmission/reception unit 207. The path (N−1) is a path passing through a transmission unit of the transmission/reception front end-processing unit 203a(N−1), the calibration network 205, the switch 206, and the reception unit of the calibration transmission/reception unit 207. The path N is a path passing through a transmission unit of the transmission/reception front end-processing unit 203aN, the calibration network 205, the switch 206, and the reception unit of the calibration transmission/reception unit 207.

Here, the measurement target signal 1, the measurement target signal 2, . . . , the measurement target signal (N−1), and the measurement target signal N can be actually measured by the transmission/reception baseband-processing device 202.

The measurement target signal 1, the measurement target signal 2, . . . , the measurement target signal (N−1), and the measurement target signal N are signals that are each output from the reception unit of the calibration transmission/reception unit 207 when the transmission/reception baseband-processing device 202 inputs a signal of a predetermined amplitude and a predetermined phase to the transmission/reception front end-processing units 203 of the paths 1 to N. For this reason, when signals are received through the paths 1 to N, the transmission/reception baseband-processing device 202 can identify an amplitude-phase characteristic for each of the paths 1 to N on the basis of a difference between input/output signals.

The transmission/reception baseband-processing device 202 stores the path 1 and an amplitude-phase characteristic identified for the path 1 in association with each other. In addition, the transmission/reception baseband-processing device 202 stores the path 2 and an amplitude-phase characteristic identified for the path 2 in association with each other. Similarly, the transmission/reception baseband-processing device 202 stores each of the paths 3 to N and an amplitude-phase characteristic identified for each of the paths 3 to N in association with each other.

Meanwhile, the amplitude-phase characteristic of the transmission unit of the transmission/reception front end-processing unit 203a1, the amplitude-phase characteristic of the transmission unit of the transmission/reception front end-processing unit 203a2, . . . , the amplitude-phase characteristic of the transmission unit of the transmission/reception front end-processing unit 203a(N−1), and the amplitude-phase characteristic of the transmission unit of the transmission/reception front end-processing unit 203aN are actually desired to be corrected by the transmission/reception baseband-processing device 202.

In other words, in the measurement target signal 1, the measurement target signal 2, . . . , the measurement target signal (N−1), and the measurement target signal N measured by the transmission/reception baseband-processing device 202, amplitude-phase characteristics other than the amplitude-phase characteristic of the transmission unit of the transmission/reception front end-processing unit 203a1, the amplitude-phase characteristic of the transmission unit of the transmission/reception front end-processing unit 203a2, . . . , the amplitude-phase characteristic of the transmission unit of the transmission/reception front end-processing unit 203a(N−1), and the amplitude-phase characteristic of the transmission unit of the transmission/reception front end-processing unit 203aN that are correction targets are each included. In other words, the amplitude-phase characteristic CAL_RX of the reception unit of the calibration transmission/reception unit 207 that is an error in the correction is included.

Thus, in each embodiment of the present invention, the transmission/reception baseband-processing device 202 measures the amplitude-phase characteristic of the reception unit of the calibration transmission/reception unit 207 that is an error in the correction asynchronously with measurement of the measurement target signal 1, the measurement target signal 2, . . . , the measurement target signal (N−1), and the measurement target signal N when no signal is transmitted/received through the antenna 204.

The transmission/reception baseband-processing device 202 corrects a BF signal acquired by the communicator 20 from the baseband circuit unit 10 on the basis of each of the measurement target signal 1, the measurement target signal 2, . . . , the measurement target signal (N−1), and the measurement target signal N that have been measured and the amplitude-phase characteristic of the reception unit of the calibration transmission/reception unit 207.

More specifically, the transmission/reception baseband-processing device 202 performs weighted correction for a BF signal acquired from the baseband circuit unit 10 by using the following Equation (1).

$$\begin{aligned}\frac{BF\ \text{signal}\ (n)}{\text{after correction}} &= BF\ \text{signal}\ (n)\ \text{before correction} \times \\ &\quad \frac{\text{second amplitude–phase characteristic CAL\_RX}}{\text{first amplitude–phase characteristic DL\_CAL\_Weight}(n)} \\ &= BF\ \text{signal}\ (n)\ \text{before correction} \times \\ &\quad \frac{\text{second amplitude–phase characteristic CAL\_RX}}{\text{transmission/reception} \times \text{amplitude–phase}} \\ &\quad \text{front end processing 203}an \times \text{characteristic CAL\_RX}\end{aligned} \quad (1)$$

In Equation (1), the BF signal (n) before correction is a BF signal acquired by the communicator 20 from the baseband circuit unit 10. Here, n is an integer in the range of 1 to N.

In Equation (1), the first amplitude-phase characteristic DL_CAL_Weight(n) is the amplitude-phase characteristic of each of the paths 1 to N.

More specifically, the first amplitude-phase characteristic DL_CAL_Weight(n) includes the following information when the communication system 1 is transmitting/receiving no signal through the antenna 204. In other words, the first amplitude-phase characteristic DL_CAL_Weight(n) includes characteristics relating to an amplitude and a phase identified by the transmission/reception baseband-processing device 202 from a difference between input/output signals of each of the path 1, the path 2, . . . , the path (N−1), and the path N while the calibration network 205 switches the connection destination in order of the transmission/reception front end-processing units 203a1, 203a2, . . . , 203a(N−1), and 203aN.

In addition, in this first amplitude-phase characteristic DL_CAL_Weight(n), the amplitude-phase characteristic CAL_RX of the reception unit of the calibration transmission/reception unit 207 is included.

In this way, the first amplitude-phase characteristic DL_CAL_Weight(n) includes the characteristic of the hardware of the transmission/reception front end-processing unit 203an and the amplitude-phase characteristic CAL_RX of the reception unit of the calibration transmission/reception unit 207.

For example, the first amplitude-phase characteristic DL_CAL_Weight(n) is represented as an equation "(An)exp(−jθn)". A first amplitude-phase characteristic DL_CAL_Weight(1) is an amplitude-phase characteristic for the path 1. A first amplitude-phase characteristic DL_CAL_Weight(2) is an amplitude-phase characteristic for the path 2. A first amplitude-phase characteristic DL_CAL_Weight(N−1) is an amplitude-phase characteristic for the path (N−1). A first amplitude-phase characteristic DL_CAL_Weight(N) is an amplitude-phase characteristic for the path N.

Here, "j" is an imaginary number. In addition, "An" is a difference between the amplitude of an output signal and the amplitude of an input signal in measurement of each path (in other words, information relating to a gain). "θn" is a difference between the phase of an output signal and the phase of an input signal in measurement of each path.

The second amplitude-phase characteristic CAL_RX in Equation (1) includes a characteristic relating to the amplitude and the phase identified from a difference between input/output signals in the measurement for the reception unit of the calibration transmission/reception unit 207 that is performed for calibration.

For example, the second amplitude-phase characteristic CAL_RX is represented as an equation "(B)exp(−jβ)". Here, "B" is a difference between the amplitude of an output signal and the amplitude of an input signal (in other words, information relating to a gain) in the reception unit of the calibration transmission/reception unit 207. In addition, "β" is a difference between the phase of an output signal and the phase of an input signal in the reception unit of the calibration transmission/reception unit 207.

The BF signal (n) after correction is a BF signal after correcting the BF signal (n) before correction using the first amplitude-phase characteristic DL_CAL_Weight(n) (=the transmission/reception front end-processing unit 203an×the amplitude-phase characteristic CAL_RX) and the second amplitude-phase characteristic CAL_RX.

When calibration is performed, the transmission/reception baseband-processing device 202 substitutes the BF signal (n) before correction received from the baseband circuit unit 10 and the first amplitude-phase characteristic DL_CAL_Weight(n) identified for each of the paths 1 to N and the second amplitude-phase characteristic CAL_RX into Equation (1).

Here, more specifically, a case in which the transmission unit of the transmission/reception front end-processing unit 203a1 of the path 1 is corrected will be illustrated as an example. In this case, the BF signal (1) before correction for the path 1 received from the baseband circuit unit 10, the first amplitude-phase characteristic DL_CAL_Weight(1) (=the transmission/reception front end-processing unit 203a1× the amplitude-phase characteristic CAL_RX), and the second amplitude-phase characteristic CAL_RX are substituted into Equation (1). A BF signal (1) after correction that is acquired through the substitution for Equation (1) is output to the transmission unit of the transmission/reception front end-processing unit 203a1.

A case in which the transmission unit of the transmission/reception front end-processing unit 203a2 of the path 2 is corrected will be illustrated as an example. In this case, the BF signal (2) before correction for the path 2 received from the baseband circuit unit 10, the first amplitude-phase characteristic DL_CAL_Weight(2) (=the transmission/reception front end-processing unit 203a2×the amplitude-phase characteristic CAL_RX), and the second amplitude-phase characteristic CAL_RX are substituted into Equation (1). A BF signal (2) after correction that is acquired through the substitution into Equation (1) is output to the transmission unit of the transmission/reception front end-processing unit 203a2.

A case in which the transmission unit of the transmission/reception front end-processing unit 203a(N−1) of the path (N−1) is corrected will be illustrated as an example. In this case, the BF signal (N−1) before correction for the path (N−1) received from the baseband circuit unit 10, the first amplitude-phase characteristic DL_CAL_Weight(N−1) (=the transmission/reception front end-processing unit 203a(N−1)×the amplitude-phase characteristic CAL_RX), and the second amplitude-phase characteristic CAL_RX are_CAL_RX into Equation (1). A BF signal (N−1) after correction that is acquired through the substitution into Equation (1) is output to the transmission unit of the transmission/reception front end-processing unit 203a(N−1).

A case in which the transmission unit of the transmission/reception front end-processing unit 203aN of the path N is corrected will be illustrated as an example. In this case, the BF signal (N) before correction for the path N received from the baseband circuit unit 10, the first amplitude-phase characteristic DL_CAL_Weight(N) (=the transmission/reception front end-processing unit 203aN×the amplitude-phase characteristic CAL_RX), and the second amplitude-phase characteristic CAL_RX are_CAL_RX into Equation (1). A BF signal (N) after correction that is acquired through the substitution into Equation (1) is output to the transmission unit of the transmission/reception front end-processing unit 203a(N).

Accordingly, a transmission BF signal(n) that is actually transmitted from each antenna 204 when the BF signal (n) after correction is input to the transmission/reception front end-processing unit 203an is represented by the following Equation (2). The BF signal (n) after correction in Equation (2) can be substituted in accordance with Equation (1).

$$\begin{aligned}\frac{\text{Transmission}}{BF\ \text{signal}\ (n)} &= BF\ \text{signal}\ (n)\ \text{after correction} \times \text{transmission}/ \\ &\quad \text{reception front end processing unit } 203an \\ &= BF\ \text{signal}\ (n)\ \text{before correction} \times \\ &\quad \frac{\text{second amplitude-phase}}{\text{characteristic CAL\_RX}} \times \frac{\text{transmission/reception}}{\text{front end-processing}} \\ &\quad \frac{\text{first amplitude-phase characteristic}}{\text{DL\_CAL\_Weight}(n)} \\ &= BF\ \text{signal}\ (n)\ \text{before correction} \times \\ &\quad \frac{\text{second amplitude-phase}}{\text{characteristic CAL\_RX}} \times \frac{\text{transmission/reception}}{\text{front end-processing}} \\ &\quad \frac{\text{transmission/reception front}}{\text{end-}processing\ \text{unit } 203an} \times \frac{\text{amplitude-phase}}{\text{characteristic}} \\ &= BF\ \text{signal}\ (n)\ \text{before correction} \times \\ &\quad \frac{\text{second amplitude-phase characteristic CAL\_RX}}{\text{amplitude-phase characteristic CAL\_RX}}\end{aligned} \quad (2)$$

In Equation (2), the transmission/reception front end-processing unit 203an is a characteristic of the transmission/reception front end-processing unit 203an as hardware at each time.

Here, the first amplitude-phase characteristic DL_CAL_Weight(n) represents the amplitude-phase characteristic CAL_RX at the time of measurement thereof and a characteristic of the transmission/reception front end-processing unit 203an as hardware. In Equation (2), a denominator "first amplitude-phase characteristic DL_CAL_Weight(n)" is substituted into "transmission/reception front end-processing unit 203a(n)×amplitude-phase characteristic CAL_RX".

In addition, the measurement of the first amplitude-phase characteristic DL_CAL_Weight(n) is measurement that is constantly performed when the communication system 1 does not perform communication through the antenna 204.

The measurement of the second amplitude-phase characteristic CAL_RX is measurement that is performed at the time of calibration. In other words, a timing at which the first amplitude-phase characteristic DL_CAL_Weight(n) is measured and a timing at which the second amplitude-phase characteristic CAL_RX is measured are configured to be asynchronous. Here, a difference between the two timings can be regarded as a timing difference of a degree that can be ignored as a change in the characteristic over time or a change in the characteristic accompanying a temperature change.

For this reason, the term "second amplitude-phase characteristic CAL_RX×transmission/reception front end-processing unit 203 an" of the numerator and the term "transmission/reception front end-processing unit 203a(n)× amplitude-phase characteristic CAL_RX" of the denominator in Equation (2) are reduced. In other words, in accordance with the transmission/reception front end-processing units 203a(n), terms of the numerator and the denominator in Equation (2) are reduced.

As a result, the transmission BF signal (n) in Equation (2) can be represented as an equation "BF signal (n) before correction×second amplitude-phase characteristic CAL_RX/amplitude-phase characteristic CAL_RX". Here, if the second amplitude-phase characteristic CAL_RX can be acquired such that "the second amplitude-phase characteristic CAL_RX=the amplitude-phase characteristic CAL_RX", these divisional terms are cancelled out. In this way, only the desired BF signal (n) before correction is finally radiated with a predetermined transmission output level absolute value from each transmitter through the antenna 204.

On the contrary, in a calibration method disclosed in a patent document "Japanese Unexamined Patent Application, First Publication No. 2005-348335" that is a comparison target and the like, the second amplitude-phase characteristic CAL_RX is handled as a fixed value. For this reason, since "the second amplitude-phase characteristic CAL_RX≠the amplitude-phase characteristic CAL_RX", amplitude-phase variations of all the transmitters are the same, however, there is a problem in that a transmission output level absolute value changes from a predetermined value.

Thus, in this embodiment, the BF signal (n) before correction is corrected by applying the first amplitude-phase characteristic DL_CAL_Weight(n) measured as described above and the second amplitude-phase characteristic CAL_RX to Equation (1). In this way, as represented in Equation (2), the transmission BF signal (n) can be set as the BF signal (n) before correction (in other words, a desired BF signal to be transmitted from the antenna 204).

The principle of calibration common to embodiments of the present invention has been described above.

First Embodiment (Configuration of Communication System 1)

Figure 2:
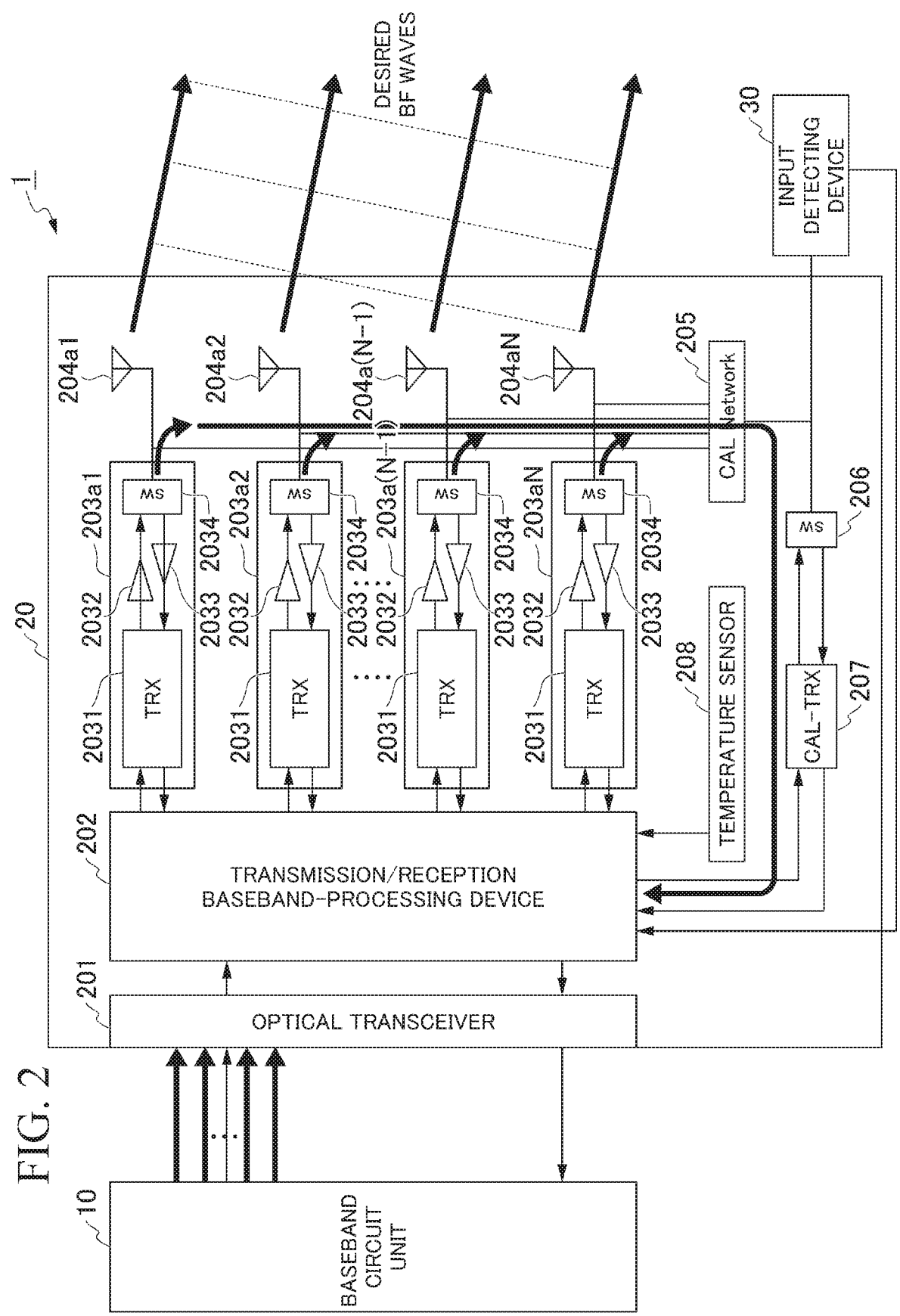
FIG. 2 is a diagram illustrating the configuration of a communication system according to a first embodiment of the present invention.

A communication system 1 according to a first embodiment of the present invention, as illustrated in FIG. 2, includes a baseband circuit unit 10 and a communicator 20. The communication system 1 includes a temperature sensor 208. The communication system 1 measures a second amplitude-phase characteristic CAL_RX at each temperature in advance at the time of a test immediately before shipment of the communicator 20 or the like. The communication system 1 stores measurement results in a data table as correction values and performs calibration using the correction values.

In FIG. 2, an input-detecting device 30 used in a case in which the data table is generated is illustrated. The input-detecting device 30 will be described together with generation of a data table TBL1 to be described later.

The communicator 20 includes an optical transceiver 201, a transmission/reception baseband-processing device 202, transmission/reception front end-processing units 203, antennas 204, a calibration network 205, a switch 206, a calibration transmission/reception unit 207, and a temperature sensor 208 and an input-detecting unit 209 (not illustrated in FIG. 2).

The input-detecting unit 209, when performing calibration, detects a signal for calibration that is output by the transmission/reception baseband-processing device 202 at the position of the switch 206. The input-detecting unit 209 outputs a result of the detection to the transmission/reception baseband-processing device 202.

The temperature sensor 208 measures a temperature at the communicator 20. The temperature sensor 208 outputs a result of the measurement of the temperature to the transmission/reception baseband-processing device 202. In addition, it is preferable that the temperature sensor 208 be disposed near a processing unit of the communicator 20 having the highest influence on calibration when the temperature of the communicator 20 varies, for example, the calibration transmission/reception unit 207.

The transmission/reception baseband-processing device 202, as illustrated in FIG. 3, includes a communication-processing unit 2021, a storage unit 2022, a calibration transmission/reception unit 2023, a temperature information-acquiring unit 2024, a calibration-processing unit 2025, and a calibration signal-generating unit 2026.

The communication-processing unit 2021 performs a process of communicating with an external device through the antennas 204.

For example, the communication-processing unit 2021 includes a DA converter and converts a digital transmission signal received from the baseband circuit unit 10 into an analog transmission signal. Then, the communication-processing unit 2021 outputs the analog transmission signal to the transmission/reception front end-processing unit 203.

In addition, for example, the communication-processing unit 2021 includes an AD converter and converts an analog reception signal received from the transmission/reception front end-processing unit 203 into a digital reception signal. Then, the communication-processing unit 2021 outputs the digital reception signal to the baseband circuit unit 10 through the optical transceiver 201.

The storage unit 2022 stores various kinds of information required for a process performed by the transmission/reception baseband-processing device 202. For example, the storage unit 2022 stores Equation (1) used for identifying a BF signal (n) after correction. In addition, for example, the storage unit 2022 stores a data table TBL1 as illustrated in FIG. 4 in which a plurality of temperatures of the communicator 20 and correction values each corresponding to the plurality of temperatures are associated with each other.

Temperatures and correction values in the data table TBL1 are the correction values determined by measuring second amplitude-phase characteristics CAL_RX for a plurality of temperatures in advance. For example, at the time of a test immediately before the shipment of the communicator 20, the communicator 20 is put into a thermostatic chamber, and the temperature of the thermostatic chamber is changed such that measured values measured by the temperature sensor 208, for example, become −30 degrees, 0 degrees, 25 degrees, and 50 degrees. A second amplitude-phase characteristic CAL_RX measured at each of such temperatures is a correction value at each temperature.

In addition, details of the measurement of a second amplitude-phase characteristic CAL_RX at each temperature will be described later.

The calibration signal-generating unit 2026 outputs a signal having a predetermined amplitude and a predetermined phase used for generating a data table TBL1 to the calibration transmission/reception unit 207 through the calibration transmission/reception unit 2023.

In addition, the calibration signal-generating unit 2026 outputs a signal having a predetermined amplitude and a predetermined phase to each of the transmission/reception front end-processing units 203 through the calibration transmission/reception unit 2023.

For example, when the transmission/reception baseband-processing device 202 is transmitting/receiving no signal through the antenna 204, the calibration signal-generating unit 2026 outputs, through the calibration transmission/reception unit 2023, the BF signal (n) before correction received from the baseband circuit unit 10 in order of the paths 1 to N.

The temperature information-acquiring unit 2024 acquires a result of measurement of a temperature of the communicator 20 from the temperature sensor 208 at predetermined times. Here, the predetermined time, for example, is a time representing a time interval at which the transmission/reception baseband-processing device 202 performs the process of calibration (for example, a time of about 1 millisecond to several hundreds of milliseconds).

When a result of measurement of the temperature of the communicator 20 is acquired, the temperature information-acquiring unit 2024 outputs the result of the measurement to the calibration-processing unit 2025.

The calibration-processing unit 2025 performs the process of calibration for the communicator 20 on the basis of signals transmitted and received when the transmission/reception baseband-processing device 202 is transmitting/receiving no signal through the antenna 204.

For example, when the transmission/reception baseband-processing device 202 is transmitting/receiving no signal through the antennas 204, the calibration-processing unit 2025 transmits a predetermined input signal to each of the paths 1 to N and receives an output signal of each of the paths. Then, the calibration-processing unit 2025 identifies a first amplitude-phase characteristic DL_CAL_Weight(n) on the basis of a relationship between input/output signals. In addition, the calibration-processing unit 2025 transmits a predetermined input signal to the calibration transmission/reception unit 207 and identifies a second amplitude-phase characteristic CAL_RX on the basis of transmitted and received signals. Then, the calibration-processing unit 2025 corrects the BF signal (n) before correction by applying the first amplitude-phase characteristic DL_CAL_Weight(n) and the second amplitude-phase characteristic CAL_RX to Equation (1).

(Generation of Data Table TBL1)

Next, generation of the data table TBL1 will be described.

The generation of the data table TBL1 is performed before the shipment of the communicator 20, for example, at the time of a test immediately before the shipment of the communicator 20. The input-detecting device 30, as illustrated in FIG. 2, is connected to the switch 206. The input-detecting device 30 is a device that can measure a signal from the switch 206 using the amplitude and the phase of an input signal transmitted from the transmission/reception baseband-processing device 202 as references and is disconnected from the switch 206 when the generation of the data table TBL1 ends.

Before the shipment of the communicator 20, the communicator 20 is put into a thermostatic chamber, and the temperature of the thermostatic chamber is changed. Then, measurement as below is performed at each temperature, and a correction value is identified.

The calibration-processing unit 2025 transmits an input signal having a predetermined amplitude and a predetermined phase to the calibration transmission/reception unit 207 through the calibration transmission/reception unit 2023 when the data table TBL1 is generated.

The transmission unit of the calibration transmission/reception unit 207 receives an input signal from the transmission/reception baseband-processing device 202 and outputs an output signal to the switch 206. This output signal is returned to the transmission/reception baseband-processing device 202 through the reception unit of the calibration transmission/reception unit 207.

The input-detecting device 30 measures a signal from the switch 206. The input-detecting device 30 transmits a result of the measurement representing the amplitude and the phase of the measured signal to the transmission/reception baseband-processing device 202.

The calibration-processing unit 2025 receives the result of the measurement representing the amplitude and the phase from the input-detecting device 30 through the calibration transmission/reception unit 2023.

In addition, the calibration-processing unit 2025 receives, through the calibration transmission/reception unit 2023, the signal returned to the transmission/reception baseband-processing device 202 from the switch 206 through the reception unit of the calibration transmission/reception unit 207.

The calibration-processing unit 2025 calculates an amplitude-phase characteristic of a gain of the transmission unit of the calibration transmission/reception unit 207 on the basis of a difference between the result of the measurement representing the amplitude and the phase received from the input-detecting device 30 and a predetermined input signal transmitted to the calibration transmission/reception unit 207.

In addition, the calibration-processing unit 2025 calculates an amplitude-phase characteristic of a gain combining the transmission unit and the reception unit of the calibration transmission/reception unit 207 on the basis of a difference between the signal returned to the transmission/reception baseband-processing device 202 from the switch 206 through the reception unit of the calibration transmission/reception unit 207 and the predetermined input signal transmitted to the calibration transmission/reception unit 207.

Then, the calibration-processing unit 2025 subtracts the amplitude-phase characteristic of the gain of the transmission unit of the calibration transmission/reception unit 207 from the amplitude-phase characteristic of the gain combining the transmission unit and the reception unit of the calibration transmission/reception unit 207. The calibration-processing unit 2025 identifies a result of the subtraction as a second amplitude-phase characteristic CAL_RX that is an amplitude-phase characteristic of the gain of the reception unit of the calibration transmission/reception unit 207. The second amplitude-phase characteristic CAL_RX identified by the calibration-processing unit 2025 is a correction value.

The calibration-processing unit 2025 writes the identified correction value and the temperature in the data table TBL1 in association with each other. One example of the data table TBL1 is illustrated in FIG. 4.

The data table TBL1 is generated as described above.
(Process of Calibration)

Next, the process of calibration performed by the communication system 1 will be described.

Figure 5:
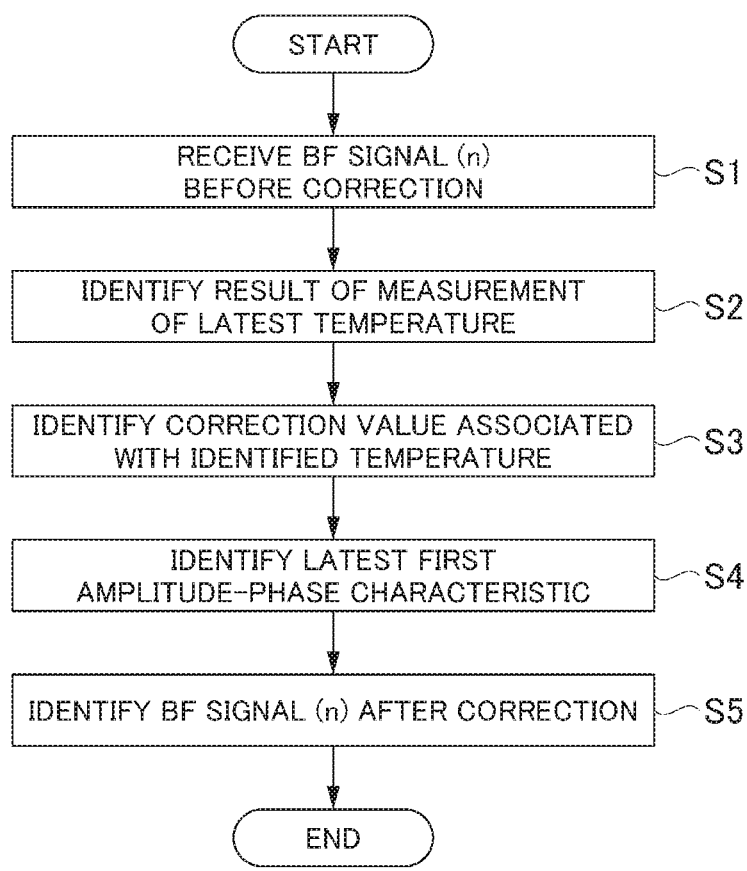
FIG. 5 is a diagram illustrating a process flow of the communication system according to the first embodiment of the present invention.

Here, the process flow of the communication system 1 illustrated in FIG. 5 will be described.

It is assumed that a data table TBL1 has been generated in advance and has been written in the storage unit 2022. In addition, it is assumed that, when the transmission/reception baseband-processing device 202 is transmitting/receiving no signal through the antennas 204, the calibration-processing unit 2025 identifies a first amplitude-phase characteristic DL_CAL_Weight(n) on the basis of a relationship between input and output signals for each of the paths 1 to N. Furthermore, it is assumed that the calibration-processing unit 2025 receives a result of measurement of the temperature of the communicator 20 measured by the temperature sensor 208 for every predetermined time (for example, for every one second).

The baseband circuit unit 10 outputs a BF signal (n) before correction to the communicator 20.

The calibration network 205 receives the BF signal (n) before correction from the baseband circuit unit 10 (Step S1).

When the BF signal (n) before correction is received from the baseband circuit unit 10, the calibration network 205 identifies a result of measurement of a latest temperature received from the temperature sensor 208 (Step S2).

The calibration network 205 identifies a temperature that is the closest to the identified temperature in the data table TBL1. Then, the calibration network 205 identifies a correction value associated with the identified temperature in the data table TBL1 (Step S3).

In addition, when the BF signal (n) before correction is received from the baseband circuit unit 10, the calibration network 205 identifies a latest first amplitude-phase characteristic DL_CAL_Weight(n) (Step S4).

The calibration network 205 substitutes the BF signal (n) before correction received from the baseband circuit unit 10 into the BF signal (n) before correction in Equation (1). The calibration network 205 substitutes the latest first amplitude-phase characteristic DL_CAL_Weight(n) into the first amplitude-phase characteristic DL_CAL_Weight(n) in Equation (1) and substitutes the identified correction value into the second amplitude-phase characteristic CAL_RX in Equation (1). In this way, the calibration network 205 identifies a BF signal (n) after correction using Equation (1) (Step S5). The calibration network 205 outputs the identified BF signal (n) after correction to a corresponding transmission/reception front end-processing unit 203.

The process described above is performed when the calibration network 205 receives a BF signal (n) before correction from the baseband circuit unit 10.

The process of calibration performed by the communication system 1 according to the first embodiment of the present invention has been described above.
(Summing-Up of First Embodiment)

The communication system 1 according to the first embodiment of the present invention has been described above.

In order to correct and eliminate variations in the amplitude-phase characteristics of transmission/reception units connected to a plurality of antennas within an active antenna system (AAS) under an operation in a time division duplex (TDD) mode, it is required to perform calibration of the transmission/reception units.

In addition, in order to correct differences in amplitude-phase variations between transmission/reception units that occur due to outside air temperature variations and aging variations under a long-time operation of the communication system, it is important to eliminate such differences by sequentially performing calibration periodically.

By performing calibration in a communication system, differences in the amplitudes and phases of a plurality of transmission/reception units are corrected, and the amplitudes and the phases can be configured to be the same. At that time, it is required that the transmission output absolute levels of all the transmitters in the communication system are within an allowed range. The allowed range of the transmission output absolute level is set according to standards standardized by the Radio Act and the Third Generation Partnership Project (3GPP) and the like, it is necessary to obey the allowed range, and it is important to realize a stable transmission output absolute level and to maintain a down link (DL) area coverage (a service region of a link from the center of a network such as a base station or a server to users present in the vicinity thereof) to be constant.

In the communicator 20 included in the communication system 1, the transmission/reception baseband-processing device 202 includes the calibration transmission/reception unit 2023 and the calibration-processing unit 2025. The calibration transmission/reception unit 2023 receives a first signal according to the characteristics of the transmission unit of the transmission/reception front end-processing unit 203 and the reception unit of the calibration transmission/reception unit 207 and a second signal according to the characteristic of the reception unit of the calibration transmission/reception unit 207.

The calibration-processing unit 2025 corrects an input signal input to the transmission unit of the transmission/reception front end-processing unit 203 on the basis of the first signal and the second signal. Then, the calibration-processing unit 2025 corrects an input signal input to the transmission unit of the transmission/reception front end-processing units 203 using a correction value determined in advance on the basis of a result of measurement of the temperature of the communicator 20.

By employing such a configuration, the transmission/reception baseband-processing device 202 can correct the characteristic of the communicator 20 relating to the amplitude and the phase accompanying a temperature change, and a difference in amplitude and phase variations between the transmission/reception front end-processing units 203 can be eliminated.

In addition, by employing such a configuration, "second amplitude-phase characteristic CAL_RX=the amplitude-phase characteristic CAL_RX" in Equation (2), and accordingly, a beamforming signal is radiated from the antennas with a predetermined transmission output level absolute value. For this reason, the allowed range of the transmission output absolute level is obeyed, a stable transmission output absolute level is realized, and a DL area coverage (a service region of a link from the center of a network such as a base station or a server to users present in the vicinity thereof) can be maintained to be constant.

As a result, in the communication system 1 according to the first embodiment of the present invention, amplitude and phase characteristics of the transmission/reception front end-processing units 203 can be configured to be the same, and the transmission output absolute level can be maintained to be constant.

Second Embodiment (Configuration of Communication System 1)

Figure 6:
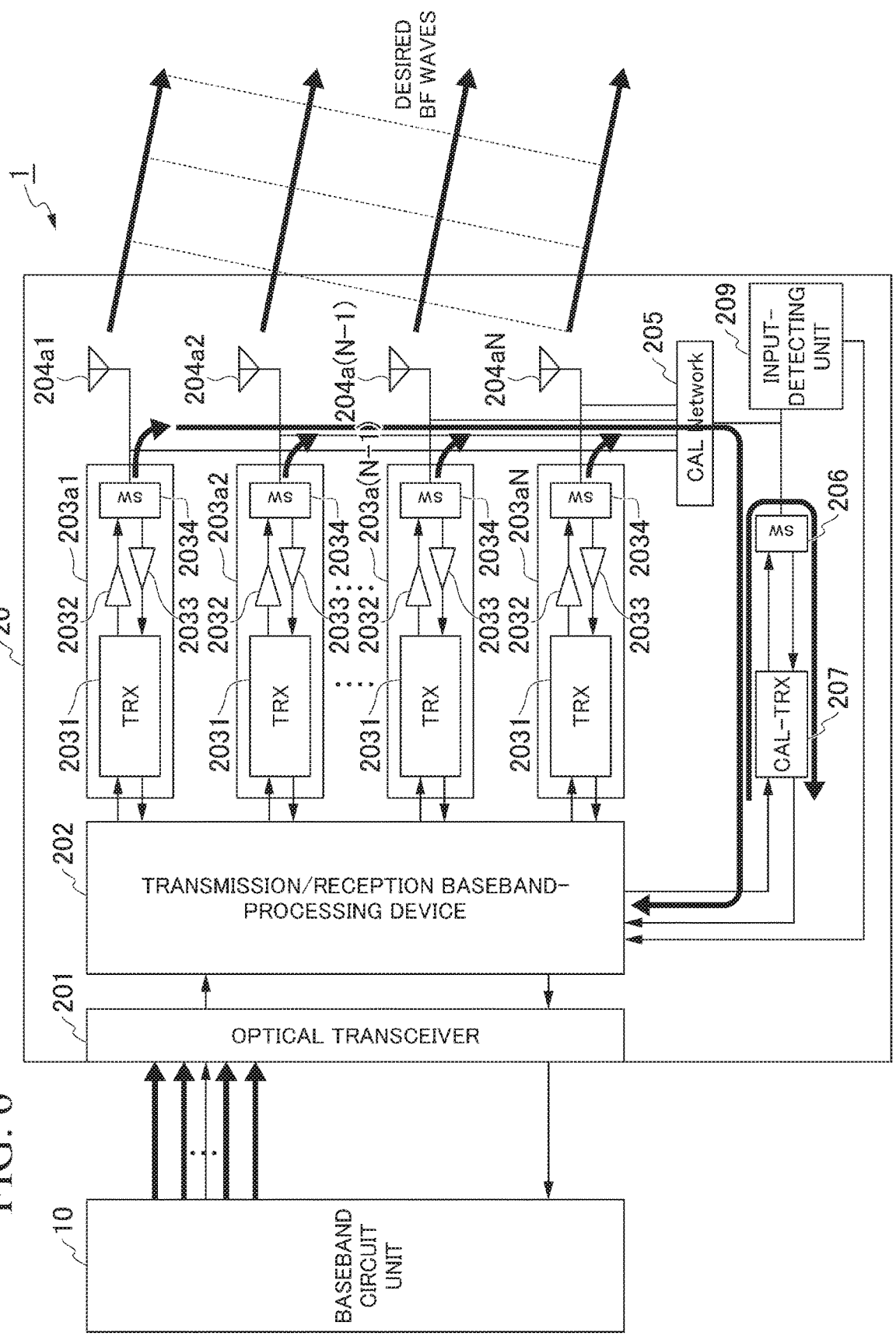
FIG. 6 is a diagram illustrating the configuration of a communication system according to a second embodiment of the present invention.

A communication system 1 according to a second embodiment of the present invention, as illustrated in FIG. 6, includes a baseband circuit unit 10 and a communicator 20. The communication system 1 compensates for differences in amplitude and phase variations between transmission/reception units that occur due to aging variations and outside air temperature variations under long-term operation by sequentially performing calibration periodically.

More specifically, the communication system 1 according to the second embodiment of the present invention sequentially estimates a change in the characteristic of a transmission/reception front end-processing unit 203 on the basis of a difference between a signal transmitted to a transmission unit of a calibration transmission/reception unit 207 and a signal returned to a transmission/reception baseband-processing device 202. The signal transmitted to the transmission unit of the calibration transmission/reception unit 207 is transmitted from the transmission/reception baseband-processing device 202 to the transmission unit of the calibration transmission/reception unit 207. The signal returned to the transmission/reception baseband-processing device 202 passes through the transmission unit of the calibration transmission/reception unit 207, turned back by a switch 206, passes through a reception unit of the calibration transmission/reception unit 207, and returns to the transmission/reception baseband-processing device 202.

The communicator 20 includes an optical transceiver 201, a transmission/reception baseband-processing device 202, transmission/reception front end-processing units 203, antennas 204, a calibration network 205, a switch 206, a calibration transmission/reception unit 207, and an input-detecting unit 209.

The input-detecting unit 209 detects a calibration signal output by the transmission/reception baseband-processing device 202 at a position of the switch 206 when calibration is performed. The input-detecting unit 209 outputs a result of the detection to the transmission/reception baseband-processing device 202.

Figure 7:
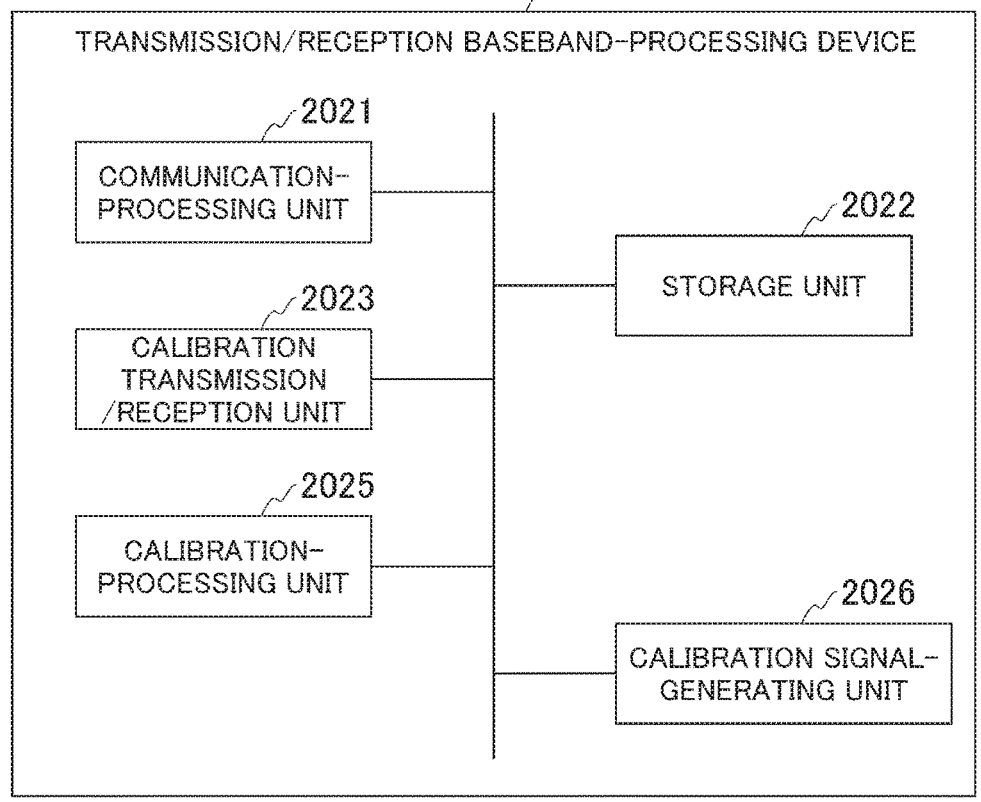
FIG. 7 is a diagram illustrating the configuration of a transmission/reception baseband-processing device according to the second embodiment of the present invention.

The transmission/reception baseband-processing device 202, as illustrated in FIG. 7, includes a communication-processing unit 2021, a storage unit 2022, a calibration transmission/reception unit 2023, a calibration-processing unit 2025, and a calibration signal-generating unit 2026.

The storage unit 2022 stores various kinds of information that is required for a process performed by the transmission/reception baseband-processing device 202. For example, the storage unit 2022 stores Equation (1) used for identifying a BF signal (n) after correction.

(Process of Calibration)

Figure 8:
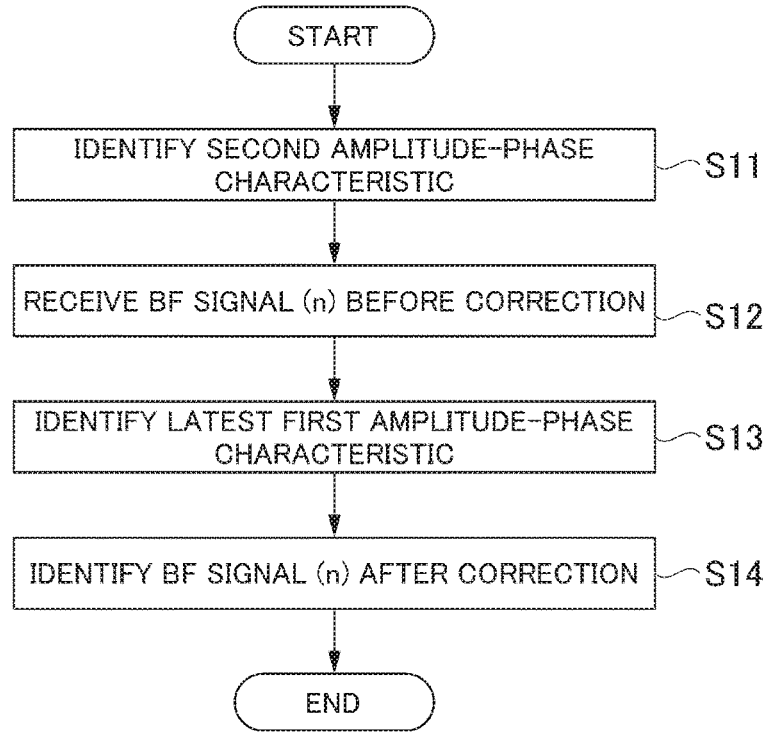
FIG. 8 is a diagram illustrating a process flow of the communication system according to the second embodiment of the present invention.

Next, the process of calibration performed by the communication system 1 will be described. Here, the process flow of the communication system 1 illustrated in FIG. 8 will be described. In addition, it is assumed that, when the transmission/reception baseband-processing device 202 is transmitting/receiving no signal through the antennas 204, the calibration-processing unit 2025 constantly identifies a first amplitude-phase characteristic DL_CAL_Weight(n) on the basis of a relationship between input and output signals for each of the paths 1 to N.

The calibration-processing unit 2025 transmits an input signal having a predetermined amplitude and a predetermined phase to the calibration transmission/reception unit 207.

The transmission unit of the calibration transmission/reception unit 207 receives an input signal from the transmission/reception baseband-processing device 202 and outputs an output signal to the switch 206. This output signal returns to the transmission/reception baseband-processing device 202 through the reception unit of the calibration transmission/reception unit 207.

The input-detecting unit 209 measures a signal from the switch 206. The input-detecting unit 209 transmits a result of the measurement representing the amplitude and the phase of the measured signal to the transmission/reception baseband-processing device 202.

The calibration-processing unit 2025 receives the result of the measurement representing the amplitude and the phase from the input-detecting unit 209 through the calibration transmission/reception unit 2023.

In addition, the calibration-processing unit 2025 receives, through the calibration transmission/reception unit 2023, the signal returned to the transmission/reception baseband-processing device 202 from the switch 206 through the reception unit of the calibration transmission/reception unit 207.

The calibration-processing unit 2025 subtracts a result of measurement representing the amplitude and the phase received from the input-detecting unit 209, in other words, an amplitude-phase characteristic of the transmission unit of the calibration transmission/reception unit 207 from an amplitude-phase characteristic that has passed through the transmission/reception unit of the calibration transmission/reception unit 207. Accordingly, the calibration-processing unit 2025 calculates a second amplitude-phase characteristic CAL_RX.

In other words, the calibration-processing unit 2025 calculates an amplitude-phase characteristic of a gain combining the transmission unit and the reception unit of the calibration transmission/reception unit 207 on the basis of a difference between a signal that has returned from the switch 206 to the transmission/reception baseband-processing device 202 through the reception unit of the calibration transmission/reception unit 207 and a predetermined input signal transmitted to the calibration transmission/reception unit 207.

Then, the calibration-processing unit 2025 subtracts the amplitude-phase characteristic of the gain of the transmission unit of the calibration transmission/reception unit 207 from the amplitude-phase characteristic of the gain combining the transmission unit and the reception unit of the calibration transmission/reception unit 207. The calibration-processing unit 2025 identifies a result of the subtraction as a second amplitude-phase characteristic CAL_RX that is the amplitude-phase characteristic of the gain of the reception unit of the calibration transmission/reception unit 207 (Step S11).

The calibration network 205 receives the BF signal (n) before correction from the baseband circuit unit 10 (Step S12).

When the BF signal (n) before correction is received from the baseband circuit unit 10, the calibration network 205 identifies a latest first amplitude-phase characteristic DL_CAL_Weight(n) (Step S13).

The calibration network 205 substitutes the BF signal (n) before correction received from the baseband circuit unit 10 into the BF signal (n) before correction in Equation (1). The calibration network 205 substitutes the latest first amplitude-phase characteristic DL_CAL_Weight(n) into the first amplitude-phase characteristic DL_CAL_Weight(n) in Equation (1) and substitutes the identified second amplitude-phase characteristic CAL_RX into the second amplitude-phase characteristic CAL_RX in Equation (1). In this way, the calibration network 205 identifies a BF signal (n) after correction (Step S14). The calibration network 205 outputs the identified BF signal (n) after correction to a corresponding transmission/reception front end-processing unit 203.

The process described above is performed at every time interval at which an aging change in the characteristic of the communicator 20 and a temperature change of the communicator 20 can be regarded as being sufficiently small.

The process of calibration of the communication system 1 according to the second embodiment of the present invention has been described above.

(Summing-Up of Second Embodiment)

The communication system 1 according to the second embodiment of the present invention has been described above.

In the communicator 20 included in the communication system 1 according to the second embodiment of the present invention, the transmission/reception baseband-processing device 202 includes the calibration transmission/reception unit 2023, the calibration-processing unit 2025, and the calibration signal-generating unit 2026.

The calibration transmission/reception unit 2023 receives a first signal according to the characteristics of the transmission unit of the transmission/reception front end-processing unit 203 and the reception unit of the calibration transmission/reception unit 207 and a second signal according to the characteristics of the reception unit of the calibration transmission/reception unit 207. The calibration-processing unit 2025 corrects an input signal input to the transmission unit of the transmission/reception front end-processing unit 203 on the basis of the first signal and the second signal. The calibration signal-generating unit 2026 generates an input signal input to the transmission unit of the transmission/reception front end-processing unit 203.

Then, the calibration transmission/reception unit 2023 outputs the input signal generated by the calibration signal-generating unit 2026 to the transmission unit of the calibration transmission/reception unit 207 and acquires the second signal output by the reception unit of the calibration transmission/reception unit 207. The calibration-processing unit 2025 corrects the input signal input to the transmission unit of the transmission/reception front end-processing unit 203 on the basis of the first signal and the second signal acquired by the calibration signal-generating unit 2026.

By employing this configuration, the transmission/reception baseband-processing device 202 can perform calibration including an aging change in the characteristic of the communicator 20. By sequentially performing calibration periodically, a difference in the amplitude-phase variation between the transmission/reception front end-processing units 203 can be eliminated.

In addition, by employing this configuration, "second amplitude-phase characteristic CAL_RX=amplitude-phase characteristic CAL_RX" in Equation (2), and accordingly, a beamforming signal is radiated from the antennas with a predetermined transmission output level absolute value. For this reason, the allowed range of the transmission output absolute level is obeyed, the stable the transmission output absolute level is realized, and a DL area coverage (a service region of a link from the center of a network such as a base station or a server to users present in the vicinity thereof) can be maintained to be constant.

As a result, in the communication system 1 according to the second embodiment of the present invention, the amplitudes and the phases of the transmission/reception front end-processing units 203 can be configured to be the same, and the transmission output absolute level can be maintained to be constant.

Third Embodiment (Configuration of Communication System 1)

Next, a communication system 1 according to a third embodiment of the present invention will be described.

Figure 9:
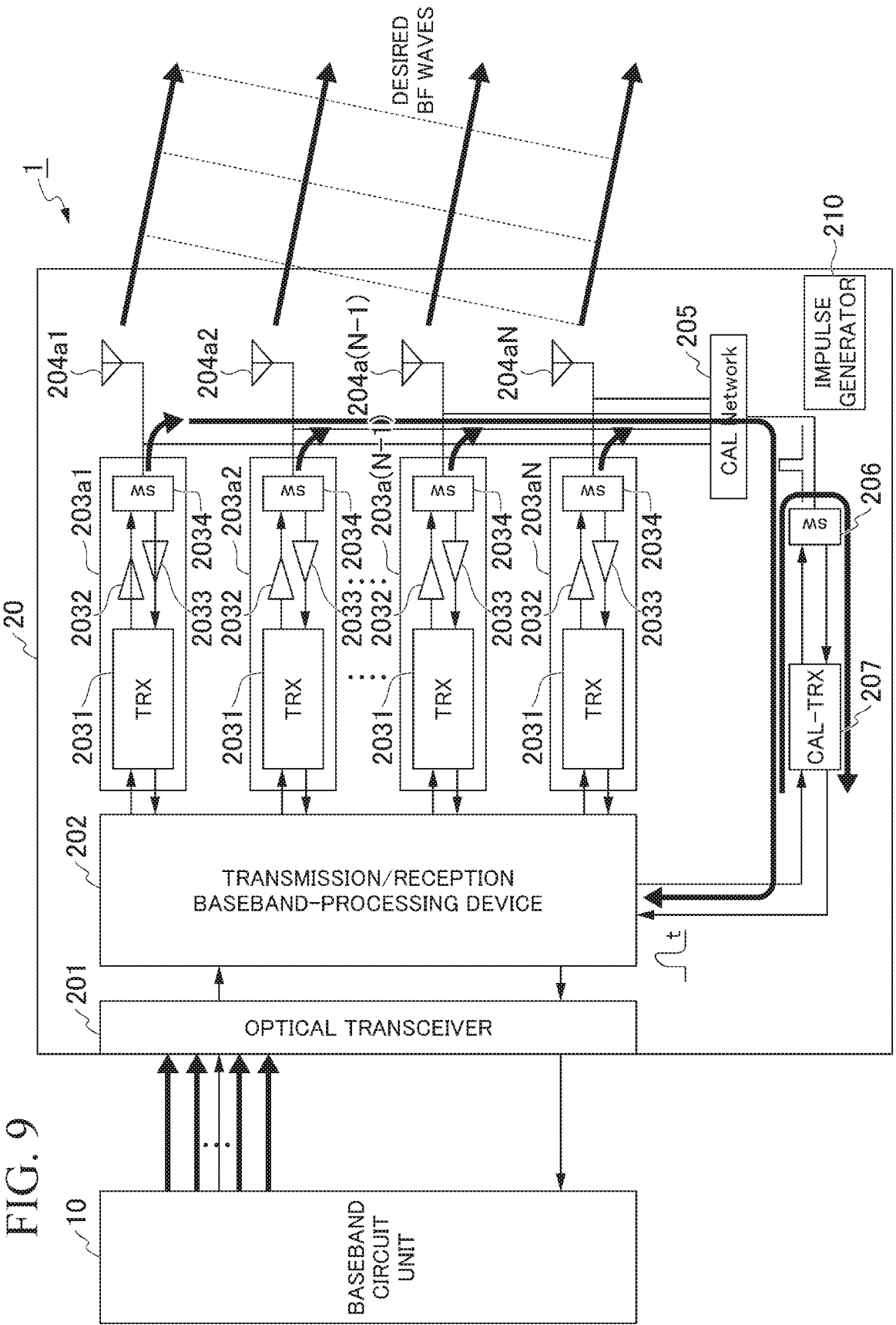
FIG. 9 is a diagram illustrating the configuration of a communication system according to a third embodiment of the present invention.

The communication system 1 according to the third embodiment of the present invention, as illustrated in FIG. 9, includes a baseband circuit unit 10 and a communicator 20. In the communication system 1, a transmission/reception baseband-processing device 202 receives, through a calibration transmission/reception unit 207, an impulse signal input to a switch 206. The communication system 1 sequentially estimates and corrects changes in the characteristics of the transmission/reception front end-processing units 203 by analyzing a signal received by the transmission/reception baseband-processing device 202.

The communicator 20, as illustrated in FIG. 9, includes an optical transceiver 201, a transmission/reception baseband-processing device 202, transmission/reception front end-processing units 203, antennas 204, a calibration network 205, a switch 206, a calibration transmission/reception unit 207, and an impulse generator 210.

Figure 10:
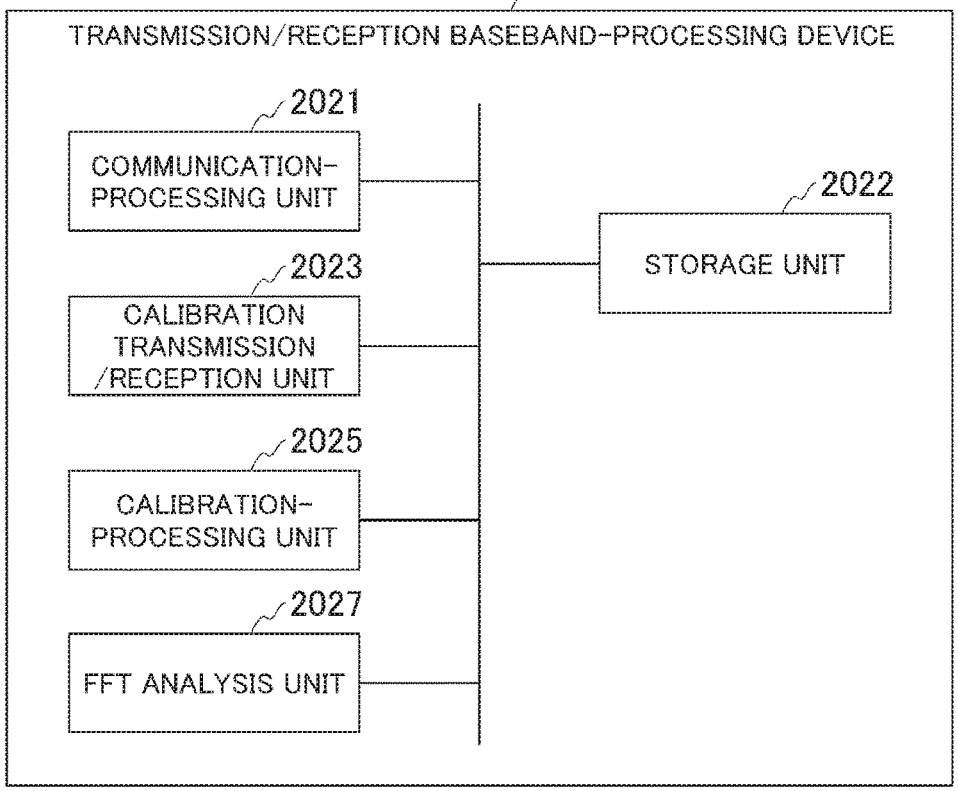
FIG. 10 is a diagram illustrating the configuration of a transmission/reception baseband-processing device according to a third embodiment of the present invention.

The transmission/reception baseband-processing device 202, as illustrated in FIG. 10, includes a communication-processing unit 2021, a storage unit 2022, a calibration transmission/reception unit 2023, a calibration-processing unit 2025, and an FFT analysis unit 2027.

The impulse generator 210 generates an impulse signal that is an input signal for a calibration process.

The impulse generator 210 outputs the generated impulse signal from the switch 206 to the calibration transmission/reception unit 207. For example, the impulse generator 210 outputs an impulse signal used for estimating a change in the characteristic of the transmission/reception front end-processing unit 203. The impulse generator 210 sequentially outputs impulse signals to the transmission/reception baseband-processing device 202 through the switch 206 and the reception unit of the calibration transmission/reception unit 207 when the transmission/reception baseband-processing device 202 is transmitting/receiving no signal through the antennas 204.

The calibration transmission/reception unit 2023 receives a signal from the impulse generator 210 through the reception unit of the calibration transmission/reception unit 207. The signal received from the impulse generator 210, through the reception unit of the calibration transmission/reception unit 207 by the calibration transmission/reception unit 2023, has an amplitude smaller than that of the signal generated by the impulse generator 210 (in other words, a signal having a "rounded" waveform). The calibration transmission/reception unit 2023 outputs the received impulse signal to the FFT analysis unit 2027.

The FFT analysis unit 2027 receives the signal having the rounded waveform from the impulse generator 210. The FFT analysis unit 2027 stores a frequency spectrum including amplitude-phase information of the impulse signal generated by the impulse generator 210 in advance. The FFT analysis unit 2027 calculates a difference by subtracting a frequency spectrum acquired by performing an FFT analysis (Fourier transform) for the signal having the rounded waveform received from the calibration transmission/reception unit 2023 from the frequency spectrum of the impulse signal stored in advance. Accordingly, the FFT analysis unit 2027 can identify a reception characteristic (amplitude-phase frequency characteristic) of the calibration transmission/reception unit 207. The FFT analysis unit 2027 outputs a result of the Fourier transform to the calibration-processing unit 2025.

When the transmission/reception baseband-processing device 202 is transmitting/receiving no signal through the antennas 204, the calibration-processing unit 2025, similar to the calibration-processing unit 2025 according to the second embodiment of the present invention, transmits a predetermined input signal of each of the paths 1 to N and receives an output signal through the path through which the input signal has been transmitted. Then, the calibration-processing unit 2025 identifies a first amplitude-phase characteristic $DL\_CAL\_Weight(n)$ on the basis of a difference between input and output signals that have been transmitted and received.

In addition, the calibration-processing unit 2025 receives a result of the Fourier transform from the FFT analysis unit 2027. Here, the result of the Fourier transform received from the FFT analysis unit 2027 by the calibration-processing unit 2025 represents an amplitude-phase characteristic for each frequency. For this reason, the calibration-processing unit 2025 can identify a second amplitude-phase characteristic $CAL\_RX$ that is the amplitude-phase characteristic of the reception unit of the calibration transmission/reception unit 207 from the result of the Fourier transform.

Then, the calibration-processing unit 2025 substitutes the BF signal (n) before correction received from the baseband circuit unit 10 into the BF signal (n) before correction in Equation (1). The calibration-processing unit 2025 substitutes the latest first amplitude-phase characteristic $DL\_CAL\_Weight(n)$ into the first amplitude-phase characteristic $DL\_CAL\_Weight(n)$ in Equation (1) and substitutes the identified second amplitude-phase characteristic $CAL\_RX$ into the second amplitude-phase characteristic $CAL\_RX$ in Equation (1). In this way, the calibration-processing unit 2025 identifies a BF signal (n) after correction.

(Process of Calibration)

Figure 11:
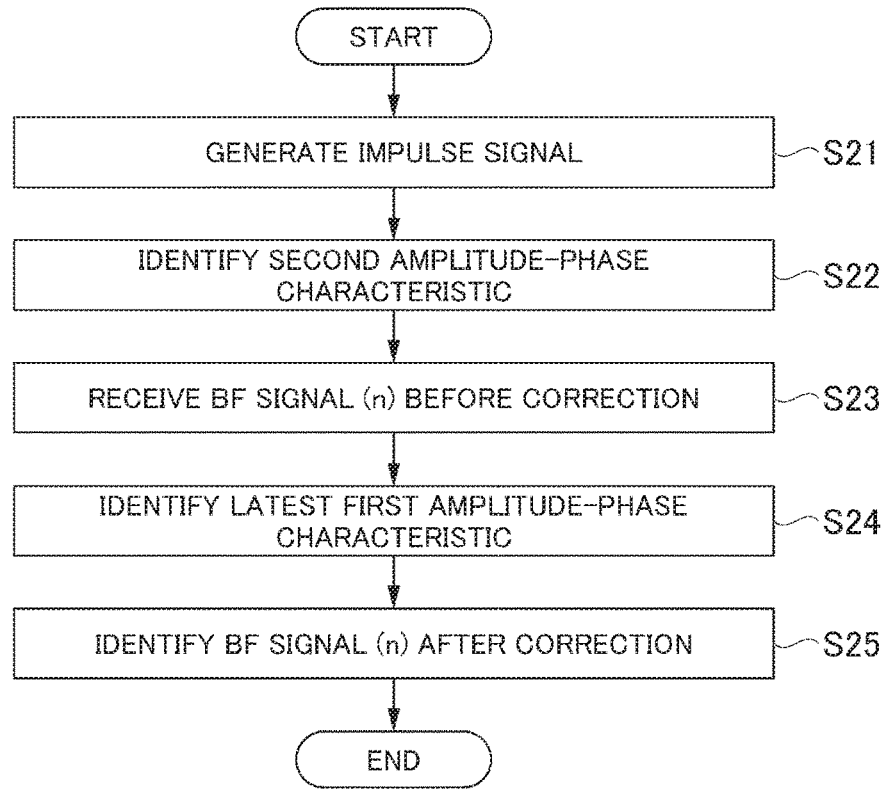
FIG. 11 is a diagram illustrating a process flow of the communication system according to the third embodiment of the present invention.

Next, the process of calibration performed by the communication system 1 will be described. Here, the process flow of the communication system 1 illustrated in FIG. 11 will be described. In addition, it is assumed that, when the transmission/reception baseband-processing device 202 is transmitting/receiving no signal through the antennas 204, the calibration-processing unit 2025 constantly identifies a first amplitude-phase characteristic $DL\_CAL\_Weight(n)$ on the basis of a relationship between input and output signals for each of the paths 1 to N.

The impulse generator 210 generates an impulse signal that is an input signal used for a calibration process (Step S21). The impulse generator 210 outputs the generated impulse signal from the switch 206 to the calibration transmission/reception unit 207.

The reception unit of the calibration transmission/reception unit 207 receives an impulse signal from the impulse generator 210 and outputs an output signal to the transmission/reception baseband-processing device 202.

The FFT analysis unit 2027 receives the output signal from the reception unit of the calibration transmission/reception unit 207 through the calibration transmission/reception unit 2023.

The FFT analysis unit 2027 calculates a frequency spectrum including amplitude-phase information of the signal received from the reception unit of the calibration transmission/reception unit 207. The FFT analysis unit 2027 identifies a second amplitude-phase characteristic $CAL\_RX$ by subtracting the calculated frequency spectrum from the frequency spectrum of the impulse signal, which has been stored, generated by the impulse generator 210 (Step S22).

The calibration network 205 receives the BF signal (n) before correction from the baseband circuit unit 10 (Step S23).

When the BF signal (n) before correction is received from the baseband circuit unit 10, the calibration network 205 identifies a latest first amplitude-phase characteristic DL_CAL_Weight(n) (Step S24).

The calibration network 205 substitutes the BF signal (n) before correction received from the baseband circuit unit 10 into the BF signal (n) before correction in Equation (1). The calibration network 205 substitutes the latest first amplitude-phase characteristic DL_CAL_Weight(n) into the first amplitude-phase characteristic DL_CAL_Weight(n) in Equation (1) and substitutes the second amplitude-phase characteristic CAL_RX identified by the FFT analysis unit 2027 into the second amplitude-phase characteristic CAL_RX in Equation (1). In this way, the calibration network 205 identifies a BF signal (n) after correction (Step S25). The calibration network 205 outputs the identified BF signal (n) after correction to a corresponding transmission/reception front end-processing unit 203.

The process described above is performed at every time interval at which an aging change in the characteristic of the communicator 20 and a temperature change of the communicator 20 can be regarded as being sufficiently small.

The process of calibration of the communication system 1 according to the third embodiment of the present invention has been described above.

The communication system 1 according to the third embodiment of the present invention has been described above.

In the communicator 20 included in the communication system 1 according to the third embodiment of the present invention, the transmission/reception baseband-processing device 202 includes the calibration transmission/reception unit 2023, the calibration-processing unit 2025, and the FFT analysis unit 2027.

The calibration transmission/reception unit 2023 receives a first signal according to the characteristics of the transmission unit of the transmission/reception front end-processing unit 203 and the reception unit of the calibration transmission/reception unit 207 and a second signal according to the characteristics of the reception unit of the calibration transmission/reception unit 207. The calibration-processing unit 2025 corrects an input signal input to the transmission unit of the transmission/reception front end-processing unit 203 on the basis of the first signal and the second signal. The FFT analysis unit 2027 calculates a difference between the frequency spectrum acquired by performing a Fourier transform for the second signal received by the calibration transmission/reception unit 2023 and the impulse signal stored in advance.

Then, the calibration-processing unit 2025 corrects an input signal input to the transmission unit of the transmission/reception front end-processing unit 203 on the basis of the first signal and the result of the Fourier transform.

By employing this configuration, the transmission/reception baseband-processing device 202, similar to the communication system 1 according to the second embodiment of the present invention, can perform calibration including an aging change in the characteristic of the communicator 20. By sequentially performing calibration periodically, a difference in the amplitude-phase variation between the transmission/reception front end-processing units 203 can be eliminated.

In addition, by employing this configuration, "second amplitude-phase characteristic CAL_RX=amplitude-phase characteristic CAL_RX" in Equation (2), and accordingly, a beamforming signal is radiated from the antennas with a predetermined transmission output level absolute value. For this reason, the allowed range of the transmission output absolute level is obeyed, the stable transmission output absolute level is realized, and a DL area coverage (a service region of a link from the center of a network such as a base station or a server to users present in the vicinity thereof) can be maintained to be constant.

As a result, in the communication system 1 according to the third embodiment of the present invention, the amplitudes and the phases of the transmission/reception front end-processing units 203 can be configured to be the same, and the transmission output absolute level can be maintained to be constant.

The transmission/reception baseband-processing device 202 having a minimal configuration according to an embodiment of the present invention will be described.

Figure 12:
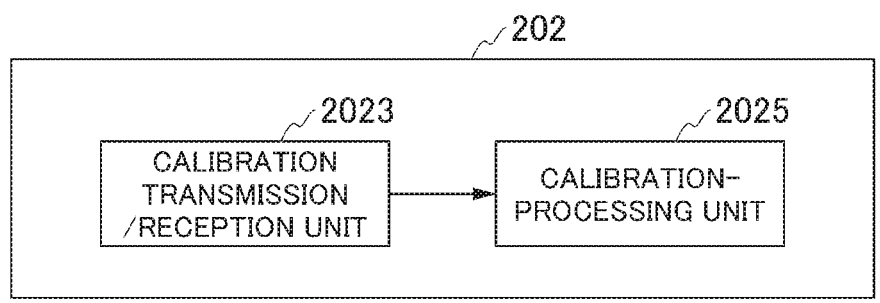
FIG. 12 is a diagram illustrating a transmission/reception baseband-processing device having a minimal configuration according to an embodiment of the present invention.

The transmission/reception baseband-processing device 202 having the minimal configuration according to an embodiment of the present invention, as illustrated in FIG. 12, includes a calibration transmission/reception unit 2023 and a calibration-processing unit 2025.

The calibration transmission/reception unit 2023 receives a first signal according to the characteristics of the transmission unit of the transmission/reception front end-processing unit and the reception unit of the calibration transmission/reception unit and a second signal according to the characteristic of the reception unit described above.

The calibration-processing unit 2025 corrects an input signal input to the transmission unit described above on the basis of the first signal described above and the second signal described above.

By configuring the transmission/reception baseband-processing device 202 in this way, the transmitters can be correctly calibrated. As a result, the transmission/reception baseband-processing device 202 can configure the amplitudes and the phases of the transmission/reception front end-processing units of the transmitter to be the same and maintain the transmission output absolute level to be constant.

In addition, regarding processes according to an embodiment of the present invention, the order of the processes may be changed in a range in which appropriate processes can be performed.

Each of the storage unit 2022 and other storage devices according to an embodiment of the present invention may be provided at any position in a range in which information can be appropriately transmitted and received. In addition, a plurality of storage units 2022 or a plurality of other storage devices may be present, and data may be stored therein in a distributed manner in a range in which information can be appropriately transmitted and received.

While the embodiments of the present invention have been described, each of the transmission/reception baseband-processing device 202 described above and the other control devices may include a computer system on the inside thereof. The procedure of the process described above is stored in a computer-readable recording medium in the form of a program, and the process described above is performed by a computer reading and executing the program. A specific example of the computer is illustrated below.

Figure 13:
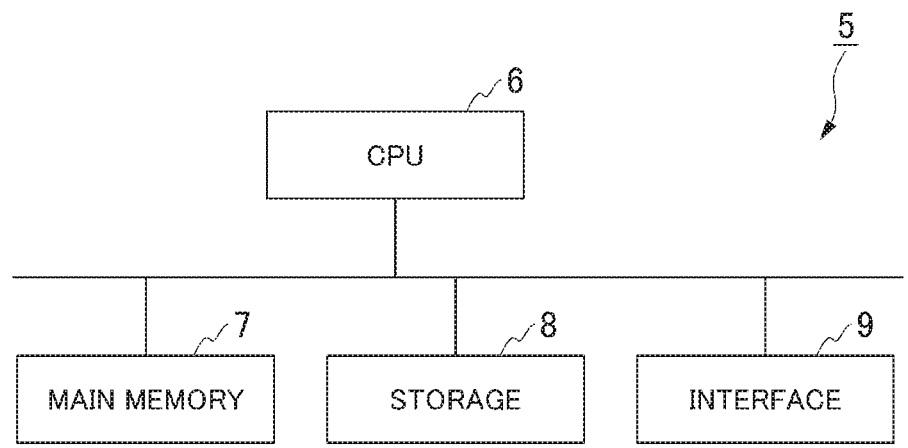
FIG. 13 is a schematic block diagram illustrating the configuration of a computer according to at least one embodiment.

FIG. 13 is a schematic block diagram illustrating the configuration of a computer according to at least one embodiment.

The computer 5, as illustrated in FIG. 13, includes a CPU 6, a main memory 7, a storage 8, and an interface 9.

For example, each of the transmission/reception baseband-processing device 202 described above and other control devices is mounted in the computer 5. An operation of each processing unit described above is stored in the storage 8 in the form of a program. The CPU 6 reads the program from the storage 8, expands the program in the main memory 7, and executes the process described above in accordance with the program. In addition, the CPU 6 secures a storage area corresponding to each storage unit described above in the main memory 7 in accordance with the program.

Examples of the storage 8 include a hard disk drive (HDD), a solid-state drive (SSD), a magnetic disk, a magneto-optical disk, a compact disc read-only memory (CD-ROM), a digital versatile disc read-only memory (DVD-ROM), a semiconductor memory, and the like. The storage 8 may be an internal medium directly connected to a bus of the computer 5 or an external medium connected to the computer 5 through the interface 9 or a communication line. In addition, in a case in which the program is transmitted to the computer 5 using a communication line, the computer 5 that has received the program may expand the program into the main memory 7 and execute the process described above. The storage 8 is a non-transitory type storage medium in at least one embodiment.

In addition, the program described above may realize a part of the function described above. Furthermore, the program described above may be a file that can realize the function described above in combination with another program stored in the computer system in advance, in other words, a so-called differential file (differential program).

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A transmission/reception baseband-processing device, comprising:
   a calibration-processing unit configured to correct an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit;
   a calibration transmission/reception unit configured to input an impulse to the calibration reception unit; and
   an FFT analysis unit configured to have a function of a Fourier transform acquiring the second characteristic according to the characteristic of the calibration reception unit by subtracting a frequency spectrum of the impulse at an output of the calibration reception unit from a frequency spectrum of the input impulse stored in advance,
   wherein the calibration-processing unit corrects the input signal input to the transmission unit on the basis of the first characteristic and the second characteristic acquired as a result of the Fourier transform.

2. The transmission/reception baseband-processing device according to claim 1, wherein the calibration-processing unit corrects the second characteristic using a correction value determined in advance on the basis of a result of measurement of a temperature of a communicator.

3. The transmission/reception baseband-processing device according to claim 1, further comprising:
   a calibration signal-generating unit configured to generate the input signal; and
   a calibration transmission/reception unit configured to output the input signal generated by the calibration signal-generating unit from the transmission unit of the calibration transmission/reception unit to the calibration reception unit,
   wherein the calibration-processing unit acquires the second characteristic according to the characteristic of the calibration reception unit by subtracting the input signal from a signal that has reached the calibration reception unit and corrects the input signal input to the transmission unit on the basis of the first characteristic and the second characteristic.

4. A communication system, comprising:
   a transmission/reception baseband-processing device; and
   a baseband circuit unit configured to output a beamforming signal to the transmission/reception baseband-processing device,
   wherein the transmission/reception baseband-processing device includes:
   a calibration-processing unit configured to correct an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit;
   a calibration transmission/reception unit configured to input an impulse to the calibration reception unit; and
   an FFT analysis unit configured to have a function of a Fourier transform acquiring the second characteristic according to the characteristic of the calibration reception unit by subtracting a frequency spectrum of the impulse at an output of the calibration reception unit from a frequency spectrum of the input impulse stored in advance,
   wherein the calibration-processing unit corrects the input signal input to the transmission unit on the basis of the first characteristic and the second characteristic acquired as a result of the Fourier transform.

5. A correction method, comprising:
   correcting an input signal input to a transmission unit on the basis of a first characteristic according to characteristics of the transmission unit of a transmission/reception front end-processing unit and a calibration reception unit that is a reception unit of a calibration transmission/reception unit and a second characteristic according to a characteristic of the calibration reception unit,
   wherein the correction method further comprises:
   inputting, by the calibration transmission/reception unit, an impulse to the calibration reception unit; and
   acquiring, by an FFT analysis unit configured to have a function of a Fourier transform, the second characteristic according to the characteristic of the calibration reception unit by subtracting a frequency spectrum of the impulse at an output of the calibration reception unit from a frequency spectrum of the input impulse stored in advance,
wherein, in the correcting, the input signal input to the transmission unit is corrected on the basis of the first characteristic and the second characteristic acquired as a result of the Fourier transform.

* * * * *